(12) United States Patent
Ueda

(10) Patent No.: US 12,638,777 B2
(45) Date of Patent: May 26, 2026

(54) EXTREME ULTRAVIOLET LIGHT GENERATION CHAMBER DEVICE AND ELECTRONIC DEVICE MANUFACTURING METHOD

(71) Applicant: Gigaphoton Inc., Tochigi (JP)

(72) Inventor: Atsushi Ueda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 386 days.

(21) Appl. No.: 18/531,191

(22) Filed: Dec. 6, 2023

(65) Prior Publication Data

US 2024/0241448 A1      Jul. 18, 2024

(30) Foreign Application Priority Data

Jan. 17, 2023    (JP) ................................. 2023-005466

(51) Int. Cl.
*H01J 37/32* (2006.01)
*G03F 7/00* (2006.01)

(52) U.S. Cl.
CPC ........ *G03F 7/70033* (2013.01); *G03F 7/7015* (2013.01); *G03F 7/7095* (2013.01); *H01J 37/32357* (2013.01); *H01J 37/32449* (2013.01)

(58) Field of Classification Search
CPC .. G03F 7/70033; G03F 7/7015; G03F 7/7095; H01J 37/32357; H01J 37/32449
See application file for complete search history.

(56) References Cited

U.S. PATENT DOCUMENTS

| | | | |
|---|---|---|---|
| 2006/0138354 A1* | 6/2006 | Bakker | G03F 7/70958 |
| | | | 250/492.21 |
| 2009/0073401 A1* | 3/2009 | Buis | G03F 7/70916 |
| | | | 355/53 |
| 2020/0241425 A1 | 7/2020 | Ueda | |
| 2022/0146943 A1 | 5/2022 | Koge et al. | |

* cited by examiner

*Primary Examiner* — Nicole M Ippolito
(74) *Attorney, Agent, or Firm* — Studebaker Brackett PLLC

(57)         ABSTRACT

An extreme ultraviolet light generation chamber device includes a chamber including a plasma generation region in which plasma is generated from a droplet target of tin irradiated with laser light; a gas supply port supplying an etching gas containing hydrogen to the internal space; a cylindrical partition wall surrounding the plasma generation region, and having an opening on the internal space side as an inlet port of a gas and an opening at the outside of the chamber as an exhaust port of the gas; an exhaust device; and a concentrating mirror. The partition wall has an inner circumferential surface on which tin is more likely to be deposited on a downstream side of a predetermined position on a downstream side of the plasma generation region in a flow direction of the gas inside the partition wall than on an upstream side of the predetermined position.

18 Claims, 11 Drawing Sheets

EXTREME ULTRAVIOLET LIGHT GENERATION CHAMBER DEVICE AND ELECTRONIC DEVICE MANUFACTURING METHOD

CROSS-REFERENCE TO RELATED APPLICATIONS

The present application claims the benefit of Japanese Patent Application No. 2023-005466, filed on Jan. 17, 2023, the entire contents of which are hereby incorporated by reference.

BACKGROUND

1. Technical Field

The present disclosure relates to an extreme ultraviolet light generation chamber device and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: US Patent Application Publication No. 2022/0146943
Patent Document 2: US Patent Application Publication No. 2020/0241425

SUMMARY

An extreme ultraviolet light generation chamber device according to an aspect of the present disclosure includes a chamber including, at an internal space thereof, a plasma generation region in which plasma is generated from a droplet target of tin irradiated with laser light; a gas supply port arranged at the chamber and configured to supply an etching gas containing hydrogen to the internal space; a cylindrical partition wall extending from the internal space to outside the chamber, surrounding the plasma generation region, and having an opening on the internal space side as an inlet port of a gas and an opening at the outside of the chamber as an exhaust port of the gas; an exhaust device configured to exhaust the gas from the exhaust port to outside the chamber; and a concentrating mirror arranged outside the partition wall at the internal space and configured to concentrate extreme ultraviolet light generated at the plasma generation region. Here, the partition wall has an inner circumferential surface on which tin is more likely to be deposited on a downstream side of a predetermined position on a downstream side of the plasma generation region in a flow direction of the gas inside the partition wall than on an upstream side of the predetermined position.

An electronic device manufacturing method according to an aspect of the present disclosure includes outputting extreme ultraviolet light generated using an extreme ultraviolet light generation chamber device to an exposure apparatus, and exposing a photosensitive substrate to the extreme ultraviolet light in the exposure apparatus to manufacture an electronic device. Here, the extreme ultraviolet light generation chamber device includes a chamber including, at an internal space thereof, a plasma generation region in which plasma is generated from a droplet target of tin irradiated with laser light; a gas supply port arranged at the chamber and configured to supply an etching gas containing hydrogen to the internal space; a cylindrical partition wall extending from the internal space to outside the chamber, surrounding the plasma generation region, and having an opening on the internal space side as an inlet port of a gas and an opening at the outside of the chamber as an exhaust port of the gas; an exhaust device configured to exhaust the gas from the exhaust port to outside the chamber; and a concentrating mirror arranged outside the partition wall at the internal space and configured to concentrate the extreme ultraviolet light generated at the plasma generation region. The partition wall has an inner circumferential surface on which tin is more likely to be deposited on a downstream side of a predetermined position on a downstream side of the plasma generation region in a flow direction of the gas inside the partition wall than on an upstream side of the predetermined position.

An electronic device manufacturing method according to an aspect of the present disclosure includes inspecting a defect of a mask by irradiating the mask with extreme ultraviolet light generated using an extreme ultraviolet light generation chamber device, selecting the mask using a result of the inspection, and exposing and transferring a pattern formed on the selected mask onto a photosensitive substrate. Here, the extreme ultraviolet light generation chamber device includes a chamber including, at an internal space thereof, a plasma generation region in which plasma is generated from a droplet target of tin irradiated with laser light; a gas supply port arranged at the chamber and configured to supply an etching gas containing hydrogen to the internal space; a cylindrical partition wall extending from the internal space to outside the chamber, surrounding the plasma generation region, and having an opening on the internal space side as an inlet port of a gas and an opening at the outside of the chamber as an exhaust port of the gas; an exhaust device configured to exhaust the gas from the exhaust port to outside the chamber; and a concentrating mirror arranged outside the partition wall at the internal space and configured to concentrate the extreme ultraviolet light generated at the plasma generation region. The partition wall has an inner circumferential surface on which tin is more likely to be deposited on a downstream side of a predetermined position on a downstream side of the plasma generation region in a flow direction of the gas inside the partition wall than on an upstream side of the predetermined position.

BRIEF DESCRIPTION OF THE DRAWINGS

Embodiments of the present disclosure will be described below merely as examples with reference to the accompanying drawings.

FIG. 4 is a schematic view showing an extreme ultraviolet light generation chamber device in a cross section perpendicular to a trajectory of a droplet target in the comparative example.

FIG. 5 is a schematic view showing the extreme ultraviolet light generation chamber device in a cross section along the trajectory of the droplet target in the comparative example.

DESCRIPTION OF EMBODIMENTS

Figure 1:
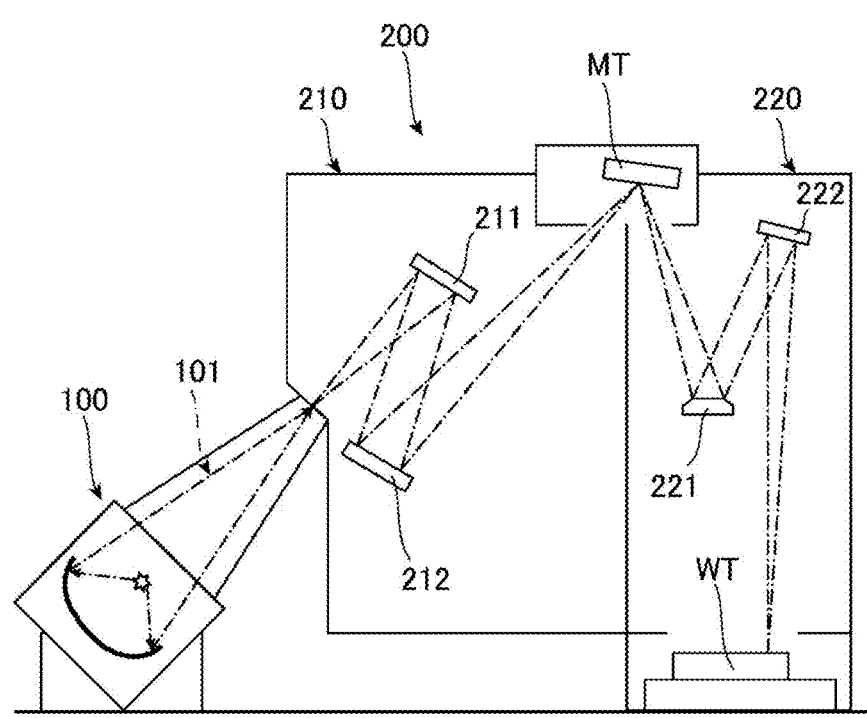
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of extreme ultraviolet light generation chamber device of first embodiment
   4.1 Configuration
   4.2 Operation
   4.3 Effect
5. Description of extreme ultraviolet light generation chamber device of second embodiment
   5.1 Configuration
   5.2 Operation
   5.3 Effect
6. Description of extreme ultraviolet light generation chamber device of third embodiment
   6.1 Configuration
   6.2 Operation
   6.3 Effect
7. Description of extreme ultraviolet light generation chamber device of fourth embodiment
   7.1 Configuration
   7.2 Operation
   7.3 Effect 8. Description of extreme ultraviolet light generation chamber device of fifth embodiment
   8.1 Configuration
   8.2 Operation
   8.3 Effect
9. Summary Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. OVERVIEW

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. DESCRIPTION OF ELECTRONIC DEVICE MANUFACTURING APPARATUS

FIG. 1 is a schematic view showing a schematic configuration example of an entire electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that configure a reflection optical system, and a workpiece irradiation unit 220 including a plurality of mirrors 221, 222 that configure a reflection optical system different from the reflection optical system of the mask irradiation unit 210. The mask irradiation unit 210 illuminates, via the mirrors 211, 212, a mask pattern of a mask table MT with EUV light 101 incident from the EUV light generation apparatus 100. The workpiece irradiation unit 220 images the EUV light 101 reflected by the mask table MT onto a workpiece (not shown) arranged on a workpiece table WT via the mirrors 221, 222. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
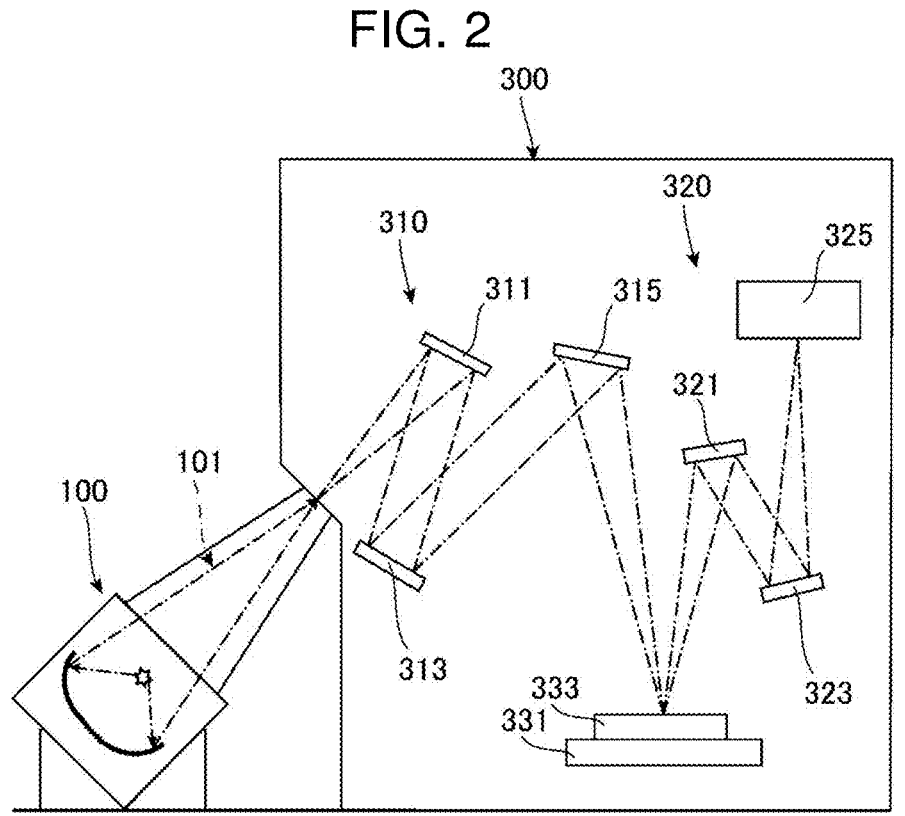
FIG. 2 is a schematic view showing a schematic configuration example of an entire electronic device manufacturing apparatus different from the electronic device manufacturing apparatus shown in FIG. 1.

FIG. 2 is a schematic view showing a schematic configuration example of an entire electronic device manufacturing apparatus different from the electronic device manufacturing apparatus shown in FIG. 1. The electronic device manufacturing apparatus shown in FIG. 2 includes the EUV light generation apparatus 100 and an inspection apparatus 300. The inspection apparatus 300 includes an illumination optical system 310 including a plurality of mirrors 311, 313, 315 that configure a reflection optical system, and a detection optical system 320 including a detector 5 and a plurality of mirrors 321, 322 that configure a reflection optical system different from the reflection optical system of the illumination optical system 310. The illumination optical system 310 reflects, with the mirrors 311, 313, 315, the EUV light 101 incident from the EUV light generation apparatus 100 to illuminate a mask 333 placed on a mask stage 331. The mask 333 includes a mask blanks before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. A defect of the mask 333 is inspected based on the image of the mask 333 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 200.

3. DESCRIPTION OF EXTREME ULTRAVIOLET LIGHT GENERATION APPARATUS OF COMPARATIVE EXAMPLE 3.1 Configuration The EUV light generation apparatus 100 of a comparative example will be described. The comparative example of the present disclosure is an example recognized by the applicant as known only by the applicant, and is not a publicly known example admitted by the applicant. Further, the following description will be given with reference to the EUV light generation apparatus 100 that outputs the EUV light 101 to the exposure apparatus 200 as a subsequent process apparatus as shown in FIG. 1. Here, the EUV light generation apparatus 100 that outputs the EUV light 101 to the inspection apparatus 300 as a subsequent process apparatus as shown in FIG. 2 can obtain the same operation and effect.

Figure 3:
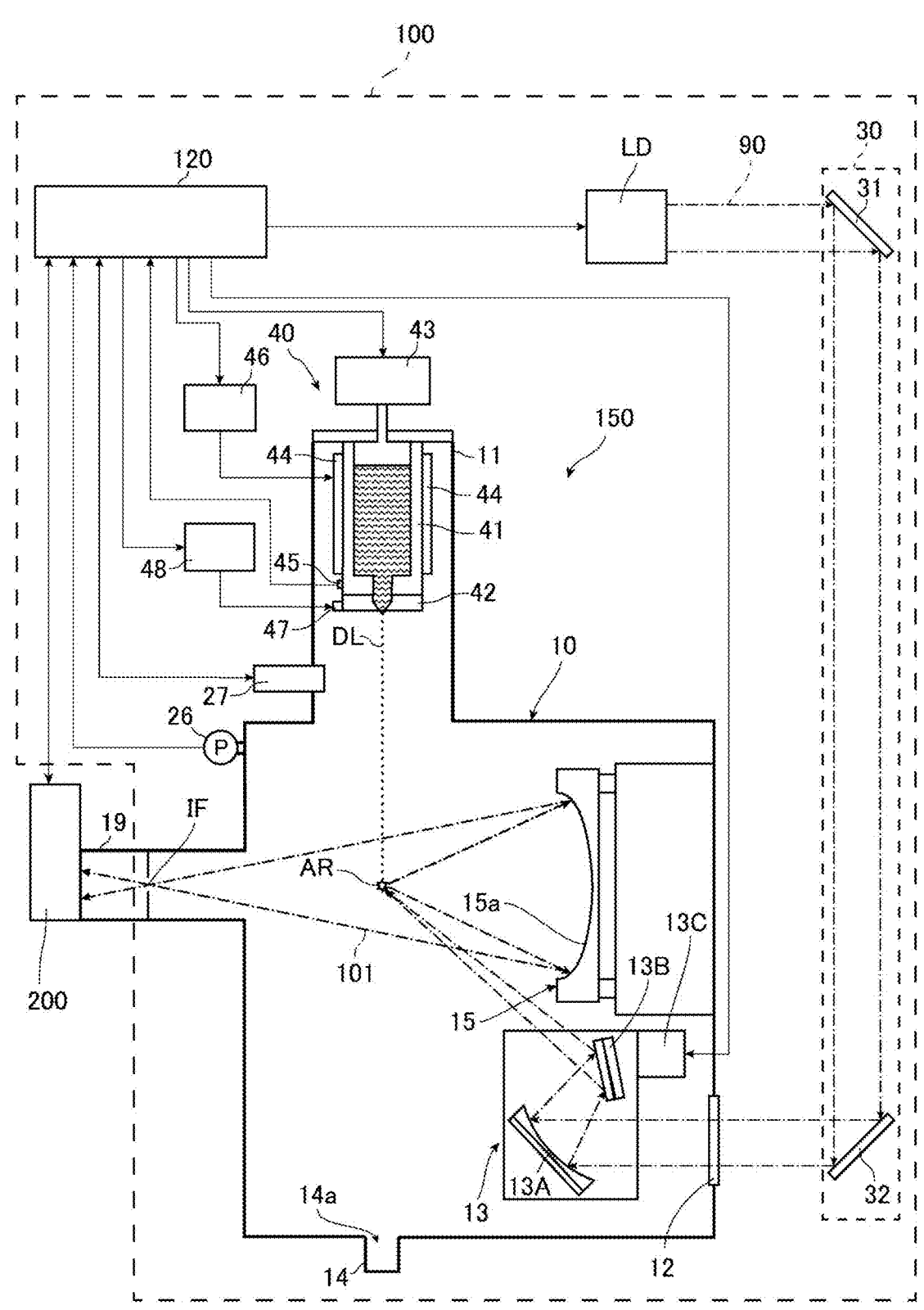
FIG. 3 is a schematic view showing a schematic configuration example of an entire extreme ultraviolet light generation apparatus of a comparative example.

FIG. 3 is a schematic view showing a schematic configuration example of the entire EUV light generation apparatus 100 of the present example. As shown in FIG. 3, the EUV light generation apparatus 100 includes an EUV light generation chamber device 150, a laser device LD, and a laser light delivery optical system 30 as a main configuration. The EUV light generation chamber device 150 includes a chamber 10 and a processor 120 as a main configuration.

The chamber 10 is a sealable container. The chamber 10 includes a sub-chamber 11, and a target supply unit 40 is attached to the sub-chamber 11 to penetrate a wall of the sub-chamber 11. The target supply unit 40 includes a tank 41, a nozzle 42, and a pressure regulator 43 to supply a droplet target DL to the internal space of the chamber 10. The droplet target DL is sometimes abbreviated as a droplet or a target.

The tank 41 stores therein a target substance which becomes the droplet target DL. The target substance contains tin. The inside of the tank 41 is in communication with the pressure regulator 43 which adjusts the pressure in the tank 41. A heater 44 and a temperature sensor 45 are attached to the tank 41. The heater 44 heats the tank 41 with current applied from a heater power source 46. Through the heating, the target substance in the tank 41 melts. The temperature sensor 45 measures, via the tank 41, the temperature of the target substance in the tank 41. The pressure regulator 43, the temperature sensor 45, and the heater power source 46 are electrically connected to the processor 120.

The nozzle 42 is attached to the tank 41 and outputs the target substance. A piezoelectric element 47 is attached to the nozzle 42. The piezoelectric element 47 is electrically connected to a piezoelectric power source 48 and is driven by a voltage applied from the piezoelectric power source 48.

The piezoelectric power source 48 is electrically connected to the processor 120. The target substance output from the nozzle 42 is formed into the droplet target DL through operation of the piezoelectric element 47.

The chamber 10 includes a target collection unit 14. The target collection unit 14 is a box body attached to the chamber 10 and communicates with the internal space of the chamber 10 through an opening 14a formed at the chamber 10. The opening 14a is arranged directly below the nozzle 42. The target collection unit 14 is a drain tank to collect any unnecessary droplet target DL having passed through the opening 14a and reaching the target collection unit 14.

The chamber 10 is provided with a window 12 through which light from the outside is transmitted, and pulse laser light 90 output from the laser device LD is transmitted through the window 12.

Further, a laser light concentrating optical system 13 is arranged at the internal space of the chamber 10. The laser light concentrating optical system 13 includes a laser light concentrating mirror 13A and a high reflection mirror 13B. The laser light concentrating mirror 13A reflects and concentrates the laser light 90 having transmitted through the window 12. The high reflection mirror 13B reflects the laser light 90 concentrated by the laser light concentrating mirror 13A. Positions of the laser light concentrating mirror 13A and the high reflection mirror 13B are adjusted by a laser light manipulator 13C so that a concentration position of the laser light 90 at the internal space of the chamber 10 coincides with a position specified by the processor 120. The light concentration position is adjusted to be a position directly below the nozzle 42, and when the target substance is irradiated with the laser light 90 at the light concentration position, plasma is generated from the target substance, and the EUV light 101 is radiated from the plasma. The region in which plasma is generated is sometimes referred to as a plasma generation region AR. The plasma generation region AR is a region having a radius of, for example, 40 mm about the plasma point and is located at the internal space of the chamber 10.

For example, an EUV light concentrating mirror 15 having a spheroidal reflection surface 15a is arranged at the internal space of the chamber 10. The EUV light concentrating mirror 15 includes, for example, a multilayer film in which silicon layers and molybdenum layers are alternately laminated, and reflects the EUV light 101 by the multilayer film. The EUV light concentrating mirror 15 is provided at a position not overlapping the laser light 90 at the internal space of the chamber 10. The reflection surface 15a reflects the EUV light 101 radiated from the plasma in the plasma generation region AR. The reflection surface 15a has a first focal point and a second focal point. The reflection surface 15a may be arranged such that, for example, the first focal point is located in the plasma generation region AR and the second focal point is located at an intermediate focal point IF.

The EUV light generation apparatus 100 includes a connection portion 19 providing communication between the internal space of the chamber 10 and the internal space of the exposure apparatus 200. A wall in which an aperture is formed is arranged in the connection portion 19. The wall is preferably arranged such that the aperture is located at the second focal point. The connection portion 19 is an outlet port of the EUV light 101 in the chamber 10, and the EUV light 101 is output from the connection portion 19 and enters the exposure apparatus 200.

Further, the EUV light generation apparatus 100 includes a pressure sensor 26 and a detection unit 27 as a target sensor. The pressure sensor 26 and the detection unit 27 are attached to the chamber 10 and are electrically connected to the processor 120. The pressure sensor 26 measures the pressure at the internal space of the chamber 10 and outputs a signal indicating the pressure to the processor 120.

The detection unit 27 has, for example, an imaging function, and detects the presence, trajectory, position, velocity, and the like of the droplet target DL output from the nozzle hole of the nozzle 42 in accordance with an instruction from the processor 120. The detection unit 27 may be arranged inside the chamber 10, or may be arranged outside the chamber 10 and detect the droplet target DL through a window (not shown) arranged on a wall of the chamber 10. The detection unit 27 includes a light receiving optical system (not shown) and an imaging unit (not shown) such as a charge-coupled device (CCD) or a photodiode. In order to improve the detection accuracy of the droplet target DL, the light receiving optical system forms an image of the trajectory of the droplet target DL and the periphery thereof on a light receiving surface of the imaging unit. When the droplet target DL passes through a light concentration region of a light source (not shown) arranged to improve contrast in the field of view of the detection unit 27, the imaging unit detects a change of the light passing through the trajectory of the droplet target DL and the periphery thereof. The imaging unit converts the detected light change into a signal related to the image data of the droplet target DL. The imaging unit outputs the electric signal to the processor 120.

The laser device LD includes a master oscillator being a light source to perform burst operation. The master oscillator outputs the pulse laser light 90 in a burst-on duration. The master oscillator is, for example, a solid-state laser device that excites a YAG crystal to which niobium (Nb) or ytterbium (Yb) is added, or a laser device that outputs the laser light 90 by exciting a gas in which helium, nitrogen, or the like is mixed in a carbon dioxide gas through electric discharge. Alternatively, the master oscillator may be a quantum cascade laser device. The master oscillator may output the pulse laser light 90 by a Q switch system. Further, the master oscillator may include an optical switch, a polarizer, and the like. The laser device LD may include an amplifier that amplifies the laser light 90 output from the master oscillator. In the burst operation, the pulse laser light 90 is continuously output at a predetermined repetition frequency in the burst-on duration and the output of the laser light 90 is stopped in a burst-off duration.

A travel direction of the laser light 90 output from the laser device LD is adjusted by the laser light delivery optical system 30. The laser light delivery optical system 30 includes a plurality of mirrors 31, 32 for adjusting the travel direction of the laser light 90. The position of at least one of the mirrors 31, 32 is adjusted by an actuator (not shown). Owing to that the position of at least one of the mirrors 31, 32 is adjusted, the laser light 90 can appropriately propagate to the internal space of the chamber 10 through the window 12.

The processor 120 of the present disclosure is a processing device including a storage device in which a control program is stored and a central processing unit (CPU) that executes the control program. The processor 120 is specifically configured or programmed to perform various processes included in the present disclosure and controls the entire EUV light generation apparatus 100. The processor 120 receives a signal related to the pressure at the internal space of the chamber 10, which is measured by the pressure sensor 26, a signal related to image data of the droplet target DL captured by the detection unit 27, a burst signal instructing the burst operation from the exposure apparatus 200, and the like. The processor 120 processes the various signals, and may control, for example, the timing at which the droplet target DL is output, the output direction of the droplet target DL, and the like. Further, the processor 120 may control the output timing of the laser device LD, the travel direction and the concentration position of the laser light 90, and the like. Such various kinds of control described above are merely exemplary, and other control may be added as necessary, as described later.

Figure 4:
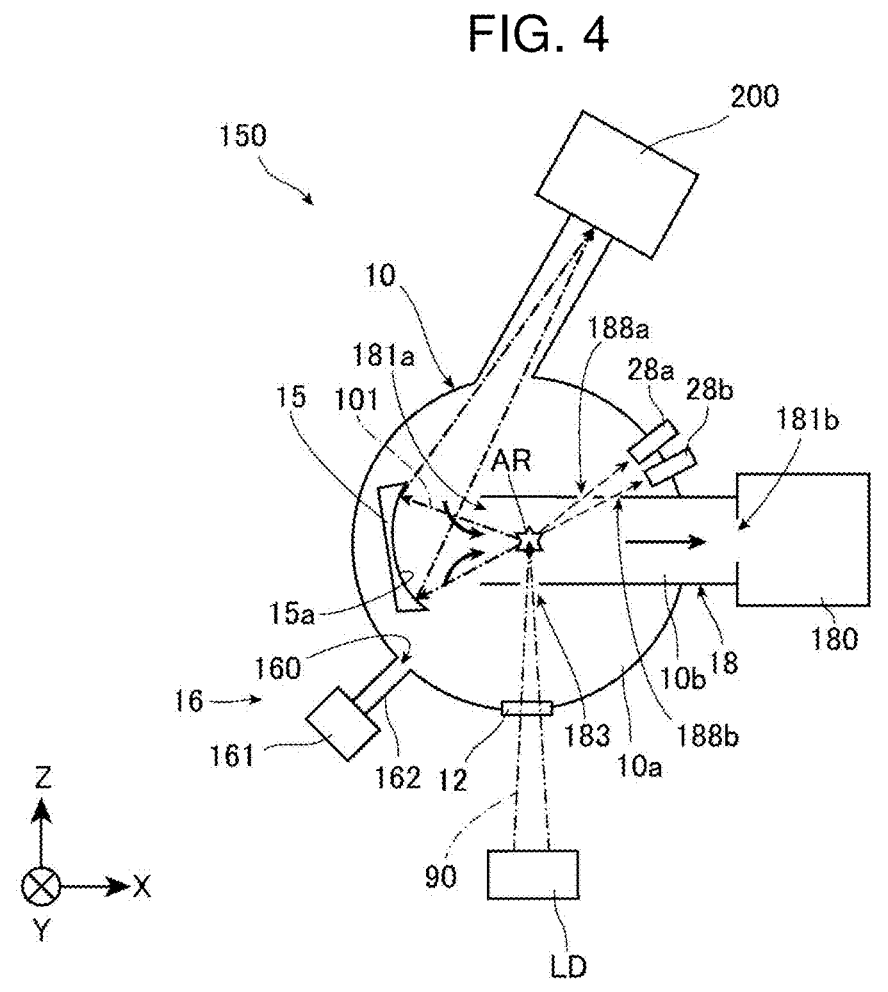
Figure 5:
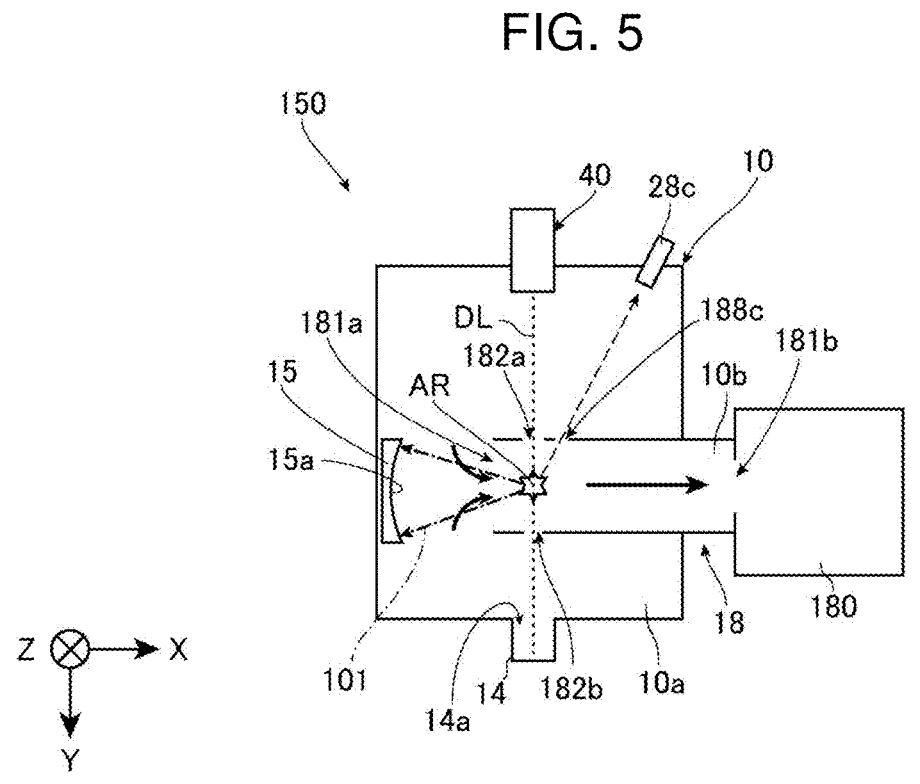

FIG. 4 is a schematic view including a cross section of the chamber 10 perpendicular to the trajectory of the droplet target DL in the comparative example, and FIG. 5 is a schematic view including a cross section of the chamber 10 along the trajectory of the droplet target DL. In FIG. 4, for simplification of illustration, the laser light concentrating mirror 13A and the high reflection mirror 13B are omitted, and a travel path of the laser light 90 from the window 12 to the plasma generation region AR is shown in a simple manner.

The EUV light generation apparatus 100 includes a plurality of sensors 28a, 28b, 28c that monitor the plasma generation region AR or the vicinity thereof. The sensors 28a, 28b, 28c may include, for example, a target sensor for detecting at least one of the presence, trajectory, position, and velocity of the droplet target DL, or may include a sensor for detecting an emission point of the EUV light 101. The sensors 28a, 28b, 28c may include an image sensor or an optical sensor, and an optical system that forms an image at the plasma generation region AR or the vicinity thereof on the image sensor or the optical sensor. Further, although not particularly shown, a light source that illuminates the plasma generation region AR with visible light may be arranged. In FIG. 3, the sensors 28a, 28b, 28c are not shown.

The EUV light generation apparatus 100 includes a cylindrical partition wall 18 extending from the internal space of the chamber 10 to the external space of the chamber 10. In FIGS. 4 and 5, a space outside the partition wall 18 at the internal space of the chamber 10 is indicated as a first space 10a, and a space inside the partition wall 18 is indicated as a second space 10b. In FIG. 3, the partition wall 18 is not shown.

The partition wall 18 is made of, for example, stainless steel, metal molybdenum, or the like. Among mutually opposed openings of the partition wall 18, an opening located at the internal space of the chamber 10 is a gas inlet port 181a, and an opening located outside the chamber 10 is a gas exhaust port 181b. The gas exhaust port 181b is connected to an exhaust device 180 including an exhaust pump.

The partition wall 18 surrounds the plasma generation region AR. That is, the plasma generation region AR is located in the second space 10b. The EUV light 101 generated from the plasma in the plasma generation region AR is incident on the EUV light concentrating mirror 15 arranged in the first space 10a from the second space 10b through the gas inlet port 181a. The EUV light concentrating mirror 15 reflects the EUV light 101 toward the intermediate focal point IF located in a direction different from the incident direction of the EUV light 101.

Further, the partition wall 18 includes a laser light transmission opening 183, a droplet supply opening 182a, a droplet discharge opening 182b, a first monitoring opening 188a, a second monitoring opening 188b, and a third monitoring opening 188c which are formed on the side surface of the partition wall 18. The laser light transmission opening 183 is provided on the optical path of the laser light 90 toward the plasma generation region AR at the internal space of the chamber 10, and the laser light 90 enters the plasma generation region AR from the first space 10*a* through the laser light transmission opening 183. The droplet supply opening 182*a* and the droplet discharge opening 182*b* are provided on the trajectory of the droplet target DL and face each other. The droplet target DL is supplied from the target supply unit 40 to the plasma generation region AR through the droplet supply opening 182*a*. The droplet discharge opening 182*b* faces the opening 14*a* connected to the target collection unit 14, and the droplet target DL that has passed through the plasma generation region AR enters the target collection unit 14 through the droplet discharge opening 182*b*. In the present example, the areas of the droplet supply opening 182*a* and the droplet discharge opening 182*b* are substantially the same as each other and are larger than the area of the laser light transmission opening 183. The first to third monitoring openings 188*a*, 188*b*, 188*c* are provided respectively between the plasma generation region AR or the vicinity thereof and the sensors 28*a*, 28*b*, 28*c*, and light from the plasma generation region AR or the vicinity thereof enter the sensors 28*a*, 28*b*, 28*c* respectively through the first to third monitoring openings 188*a*, 188*b*, 188*c*. The partition wall 18 surrounds the plasma generation region AR at the internal space of the chamber 10 except for the above openings.

An etching gas supply unit 16 is connected to the chamber 10. The etching gas supply unit 16 includes a gas supply port 160. An etching gas contains a hydrogen gas, and the etching gas of the present example is a hydrogen gas having a hydrogen concentration of 100% in effect. Therefore, in the present example, the etching gas supply unit 16 further includes a hydrogen tank 161 and a gas pipe 162. Here, the etching gas may be, for example, a balance gas having a hydrogen gas concentration of about 3%. In this case, the balance gas includes, for example, a nitrogen ($N_2$) gas or an argon (Ar) gas. A supply gas flow rate adjustment unit being a valve (not shown) may be provided at the gas pipe 162. The etching gas supply unit 16 is controlled by the processor 120. For example, when the supply gas flow rate adjustment unit is provided, the processor 120 controls the supply gas flow rate adjustment unit to adjust the flow rate of the etching gas to be supplied.

The etching gas supply unit 16 supplies the hydrogen gas in the hydrogen tank 161 to the first space 10*a* at the internal space of the chamber 10 from the gas supply port 160 through the gas pipe 162. The flow rate of the etching gas supplied from the etching gas supply unit 16 to the first space 10*a* is, for example, 10 l/min or more and 100 l/min or less. Here, the flow rate of the etching gas may be represented by nlm which represents the volume of the etching gas flowing per minute converted to that at 0° C. and 1 atm. The area of the gas inlet port 181*a* is larger than the area of each of the laser light transmission opening 183, the droplet supply opening 182*a*, the droplet discharge opening 182*b*, and the first to third monitoring openings 188*a*, 188*b*, 188*c*. Therefore, the etching gas supplied to the first space 10*a* mainly flows into the second space 10*b* through the gas inlet port 181*a* as indicated by arrows in FIGS. 4 and 5. However, the etching gas may also flow into the second space 10*b* through the laser light transmission opening 183, the droplet supply opening 182*a*, the droplet discharge opening 182*b*, and the first to third monitoring openings 188*a*, 188*b*, 188*c*.

Since the target substance is tin as described above, tin fine particles and tin charged particles are generated when the target substance is turned into plasma in the plasma generation region AR by being irradiated with the laser light 90. Further, hydrogen contained in the etching gas supplied from the etching gas supply unit 16 to the internal space of the chamber 10 becomes hydrogen radicals due to the energy of the EUV light 101. Tin constituting the fine particles and the charged particles reacts with hydrogen radicals. When tin reacts with hydrogen radicals, stannane ($SnH_4$) gas at room temperature is generated.

When the target substance is turned into plasma in the plasma generation region AR, the residual gas as an exhaust gas is generated in the second space 10*b*. The residual gas contains tin fine particles and charged particles generated through the plasma generation from the target substance, stannane generated through the reaction of the tin fine particles and charged particles with the etching gas, and an unreacted etching gas. Some of the charged particles are neutralized in the second space 10*b*, and the residual gas contains the neutralized charged particles as well. The gas exhaust port 181*b* exhausts the etching gas having flowed from the first space 10*a* to the second space 10*b* together with the residual gas to the outside of the chamber 10. Specifically, the gas exhaust port 181*b* exhausts the etching gas and the residual gas to the exhaust device 180 by suction of the exhaust device 180.

In the following, a direction along the trajectory of the droplet target DL may be referred to as a Y direction, a direction from the plasma generation region AR toward the exhaust device 180 and perpendicular to the Y direction may be referred to as an X direction, and a direction perpendicular to the Y direction and the X direction may be referred to as a Z direction.

3.2 Operation

Next, operation of the EUV light generation apparatus 100 of the comparative example will be described.

In the EUV light generation apparatus 100, for example, at the time of new installation or maintenance or the like, atmospheric air at the internal space of the chamber 10 is exhausted. At this time, purging and exhausting of the internal space of the chamber 10 may be repeated for exhausting atmospheric components. For example, an inert gas such as nitrogen or argon is preferably used for the purge gas. Thereafter, when the pressure at the internal space of the chamber 10 becomes equal to or lower than a predetermined pressure, the processor 120 starts introducing the etching gas into the first space 10*a* of the chamber 10 through the gas supply port 160 of the etching gas supply unit 16. At this time, the processor 120 may control the supply gas flow rate adjustment unit and the exhaust device 180 so that the pressure at the internal space e of the chamber 10 is maintained at the predetermined pressure. Thereafter, the processor 120 waits until a predetermined time elapses from the start of introduction of the etching gas.

Further, the processor 120 causes the gas at the internal space of the chamber 10 to be exhausted from the gas exhaust port 181*b* by the exhaust device 180, and maintains the pressure at the internal space of the chamber 10 substantially constant based on the signal indicating the pressure at the internal space of chamber 10 measured by the pressure sensor 26.

In order to heat and maintain the target substance in the tank 41 to and at a predetermined temperature equal to or higher than the melting point, the processor 120 causes the heater power source 46 to supply current to the heater 44 to increase temperature of the heater 44. In this case, the processor 120 controls the temperature of the target substance to the predetermined temperature by adjusting a value of the current supplied from the heater power source 46 to the heater 44 based on an output from the temperature sensor 45. When the target substance is tin, the predetermined temperature is equal to or higher than 231.93° C. being the melting point of tin and, for example, is 240° C. or higher and 290° C. or lower. Thus, the preparation for outputting the droplet target DL is completed.

When the preparation is completed, the processor 120 causes the pressure regulator 43 to supply the inert gas from a gas supply source (not shown) to the tank 41 and to adjust the pressure in the tank 41 so that the melted target substance is output through the nozzle hole of the nozzle 42 at a predetermined velocity. Under this pressure, the target substance is output into the first space 10a of the chamber 10 through the nozzle hole of the nozzle 42. The target substance output through the nozzle hole may be in the form of jet. At this time, the processor 120 causes the piezoelectric power source 48 to apply a voltage having a predetermined waveform to the piezoelectric element 47 to generate the droplet target DL. The piezoelectric power source 48 applies the voltage so that the waveform of the voltage value becomes, for example, a sine wave, rectangular wave, or a sawtooth wave. Vibration of the piezoelectric element 47 can propagate through the nozzle 42 to the target substance to be output through the nozzle hole of the nozzle 42. The target substance is divided at a predetermined cycle by the vibration into liquid droplet targets DL. The diameter of the droplet target DL is approximately 10 μm or more and 30 μm or less.

When the droplet target DL is output, the droplet target DL passes through the droplet supply opening 182a and travels to the plasma generation region AR. The detection unit 27 detects the passage timing of the droplet target DL passing through a predetermined position in the second space 10b of the chamber 10. The processor 120 outputs a trigger signal to control the timing of outputting the laser light 90 from the laser device LD based on the signal from the detection unit 27 so that the droplet target DL is irradiated with the laser light 90. The trigger signal output from the processor 120 is input to the laser device LD. When the trigger signal is input, the laser device LD outputs the pulse laser light 90.

The output laser light 90 enters the laser light concentrating optical system 13 through the laser light delivery optical system 30 and the window 12. The laser light 90 travels from the laser light concentrating optical system 13 toward the plasma generation region AR through the laser light transmission opening 183. Then, the droplet target DL is irradiated with the laser light 90 in the plasma generation region AR. At this time, the processor 120 controls the laser light manipulator 13C of the laser light concentrating optical system 13 so that the laser light 90 is concentrated in the plasma generation region AR. The processor 120 controls the timing of outputting the laser light 90 from the laser device LD based on the signal from the detection unit 27 so that the droplet target DL is irradiated with the laser light 90. Thus, the droplet target DL is irradiated in the plasma generation region AR with the laser light 90 concentrated by the laser light concentrating mirror 13A. Plasma is generated by the irradiation, and light including the EUV light 101 is radiated from the plasma.

Among the light including the EUV light 101 generated in the plasma generation region AR, the EUV light 101 travels to the EUV light concentrating mirror 15 after passing through the gas inlet port 181a, is concentrated at the intermediate focal point IF by the EUV light concentrating mirror 15, and then, enters the exposure apparatus 200 from the connection portion 19.

As described above, the etching gas supply unit 16 supplies the etching gas to the first space 10a of the chamber 10 through the gas supply port 160. Hydrogen contained in the etching gas is turned into hydrogen radicals due to the energy of the EUV light 101. Therefore, when tin is deposited on the reflection surface 15a of the EUV light concentrating mirror 15 or on an inner circumferential surface 184 of the partition wall 18, the tin reacts with hydrogen radicals to become stannane, and is removed from the reflection surface 15a or the inner circumferential surface 184. The etching gas or stannane in the first space 10a mainly flows into the second space 10b from the gas inlet port 181a. The exhaust device 180 suctions the etching gas together with the residual gas in the second space 10b through the gas exhaust port 181b. Accordingly, the gas in the second space 10b is exhausted to the outside of the chamber 10. The gas suctioned by the exhaust device 180 is subjected to predetermined exhaust treatment as such detoxification.

3.3 Problem

Figure 6:
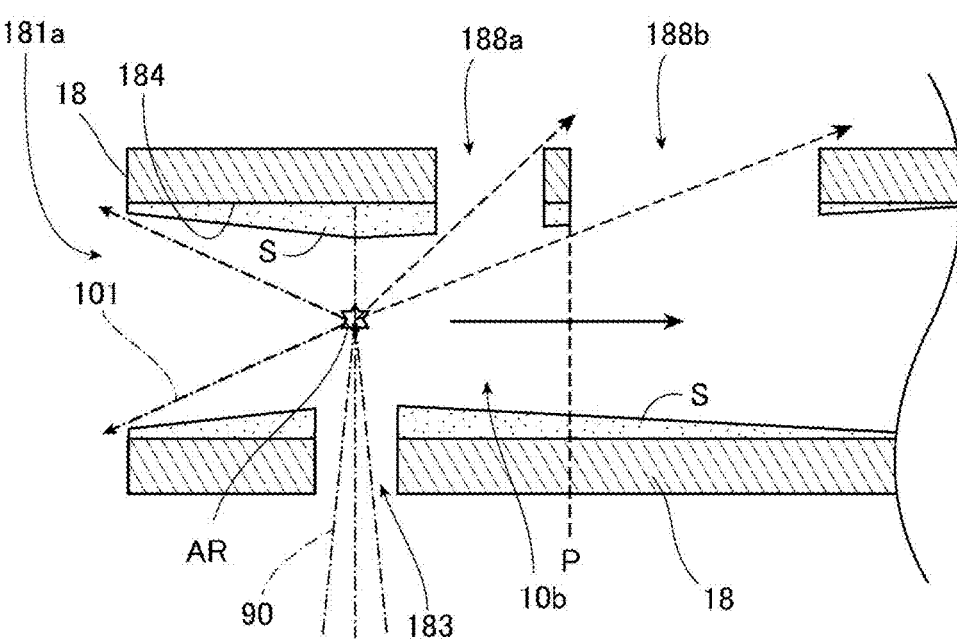
FIG. 6 is a view showing a state of a partition wall in the vicinity of a plasma generation region in the comparative example.

FIG. 6 is a view showing a state of the partition wall 18 in the vicinity of the plasma generation region AR. As shown in FIG. 6, tin S may be deposited on the inner circumferential surface 184 of the partition wall 18. Tin S to be deposited is mainly generated by decomposition of stannane in the residual gas, and the density of tin in the residual gas is the highest in the vicinity of the plasma generation region AR, and the density decreases as the distance from the plasma generation region AR increases. Therefore, in the EUV light generation chamber device 150 of the comparative example, the amount of tin S deposited on the inner circumferential surface 184 of the partition wall 18 decreases toward the downstream side from the plasma generation region AR in the flow direction of the residual gas. However, in a case in which tin S adheres to the inner circumferential surface 184 of the partition wall 18, there is a demand for tin S to adhere more on the downstream side than on the upstream side without being decreased toward the downstream side. There is a deposition rate as one measure indicating ease of deposition of tin S on the inner circumferential surface 184 of the partition wall 18 as described above. On the inner circumferential surface 184 on which tin S is more likely to be deposited, the deposition rate is large with high deposition speed on the inner circumferential surface 184. In addition, the deposition rate is small on the inner circumferential surface 184 on which tin S is less likely to be deposited. Further, an average deposition rate per unit area in a predetermined region is referred to as an average deposition rate.

Therefore, in the following embodiments, the EUV light generation chamber device 150 capable of causing tin S to adhere more on the downstream side of the partition wall 18 than on the upstream side will be exemplified.

4. DESCRIPTION OF EXTREME ULTRAVIOLET LIGHT GENERATION CHAMBER DEVICE OF FIRST EMBODIMENT

The configuration of the EUV light generation chamber device 150 of a first embodiment will be described. Any component same as that described above is denoted by an identical reference sign, and duplicate description thereof is omitted unless specific description is needed.

4.1 Configuration

Figure 7:
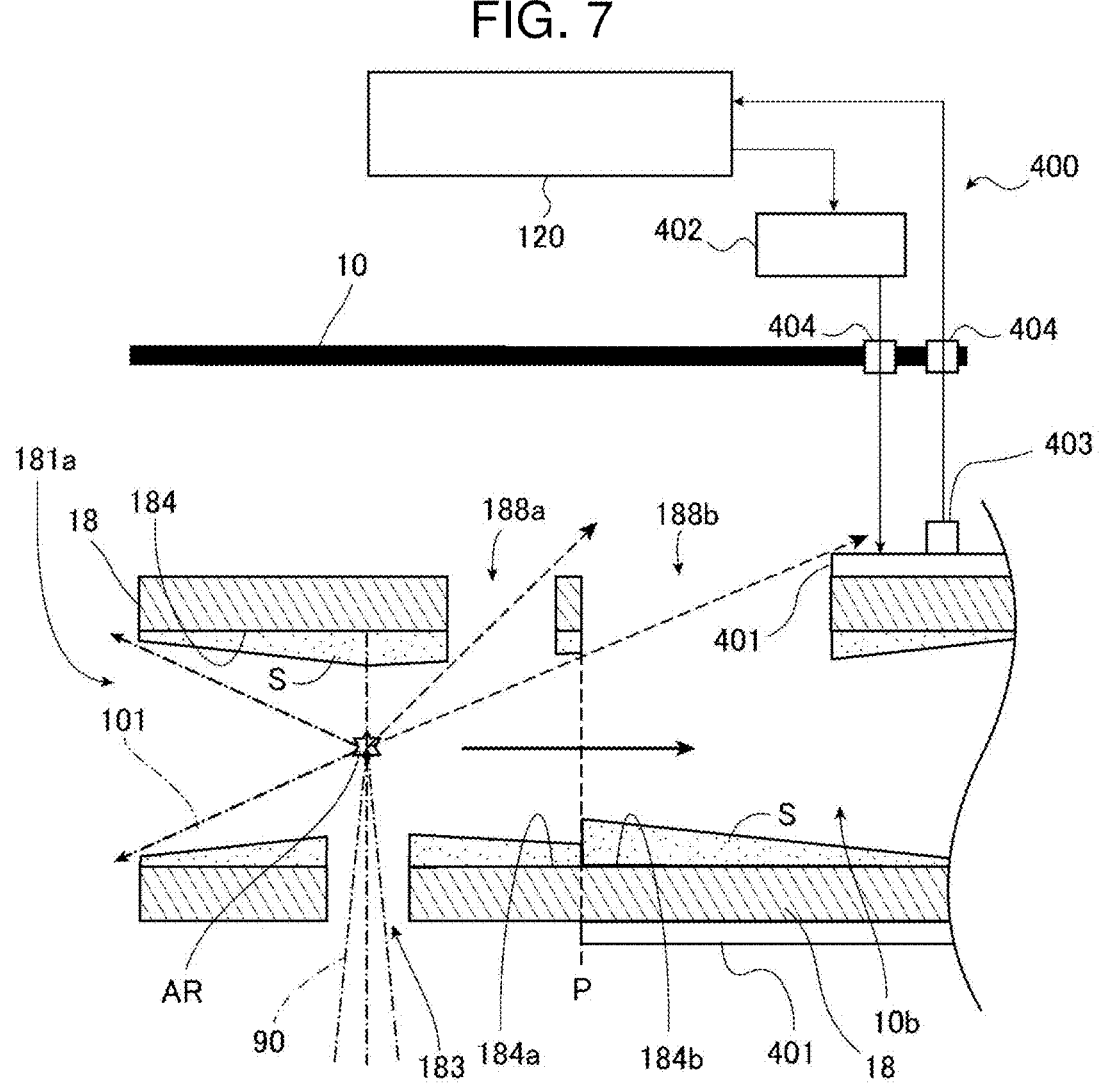
FIG. 7 is a view showing a state of the partition wall in the vicinity of the plasma generation region in a first embodiment.

FIG. 7 is a view showing a state of the partition wall 18 in the vicinity of the plasma generation region AR in the present embodiment. As shown in FIG. 7, the EUV light generation chamber device 150 of the present embodiment is different from the EUV light generation chamber device 150 of the comparative example in that a heating mechanism 400 is included. The heating mechanism 400 heats the inner circumferential surface 184 of the partition wall 18 on the downstream side of a predetermined position P in the flow direction of the gas in the second space 10*b*. Hereinafter, the downstream side and the upstream side are based on the flow direction of the gas along the longitudinal direction of the partition wall 18 in the second space 10*b*. The predetermined position P is located on the downstream side of the plasma generation region AR, and in the present embodiment, the predetermined position P is at the same position in the longitudinal direction of the partition wall 18 as the opening end, on the side close to the gas inlet port 181*a*, of the second monitoring opening 188*b* out of the first to third monitoring openings 188*a* to 188*c*. The predetermined position P may be at the same position in the longitudinal position of the partition wall 18 as the opening end, on the side close to the gas inlet port 181*a*, of the first monitoring opening 188*a* or the third monitoring opening 188*c* or may be at another position as long as the predetermined position P is on the downstream side of the plasma generation region AR. Hereinafter, in the inner circumferential surface 184 of the partition wall 18, the upstream side of the predetermined position P is referred to as an upstream inner circumferential surface 184*a*, and the downstream side of the predetermined position P is referred to as a downstream inner circumferential surface 184*b*.

The heating mechanism 400 of the present embodiment includes a heater 401, a heater power source 402, and a temperature sensor 403. The heater 401 is a heater that can be heated by being supplied with power. The heater 401 is provided in contact with the entire circumference of the outer circumferential surface of the cylindrical partition wall 18 on the downstream side of the predetermined position P. The heater 401 may be provided in the partition wall 18. The heater 401 is electrically connected to the heater power source 402 provided outside the chamber 10, and is supplied with power from the heater power source 402. The temperature sensor 403 is electrically connected to the processor 120, detects the temperature of the heater 401, and outputs a signal related to the detected temperature to the processor 120. A wiring for supplying power from the heater power source 402 to the heater 401 and a wiring for outputting a signal from the temperature sensor 403 to the processor 120 penetrate the chamber 10 respectively via a through seal 404 having high airtightness. The heater power source 402 is electrically connected to the processor 120, and power to be supplied to the heater 401 is controlled by the processor 120. Based on the signal input from the temperature sensor 403, the processor 120 controls power supply from the heater power source 402 to the heater 401 so that the partition wall 18 on the downstream side of the predetermined position P is maintained at a predetermined temperature. The temperature of the partition wall 18 maintained by the heating mechanism 400 is, for example, 40° C. or higher and 60° C. or lower during the operation of the EUV light generation chamber device 150. In FIG. 7 and some subsequent drawings, the sensors 28*a*, 28*b*, 28*c* for monitoring the state of the plasma generation region AR or the vicinity thereof are not shown.

4.2 Operation

Similarly to the comparative example, when the EUV light 101 is output, the generated stannane may be decomposed to produce tin S. In the present embodiment, on the downstream side of the predetermined position P in the flow path of the residual gas in the partition wall 18, the heater

401 of the heating mechanism 400 increases the temperature of the partition wall 18 to promote the decomposition of stannane, so that the deposition amount of tin S on the downstream inner circumferential surface 184*b* can be increased.

4.3 Effect

The EUV light generation chamber device 150 of the present embodiment includes the heating mechanism 400 for heating the downstream inner circumferential surface 184*b*. Therefore, compared with a case in which the heating mechanism 400 is not provided, the deposition amount of tin S on the downstream inner circumferential surface 184*b* can be increased as described above. Therefore, the amount of tin S flowing into the exhaust device 180 can be suppressed to extend the life of the exhaust device 180, and the interval of maintenance such as replacement of the exhaust device 180 can be extended to increase the operation efficiency of the EUV light generation chamber device 150.

In the present embodiment, as described above, the predetermined position P is at the same position in the longitudinal direction of the partition wall 18 as the opening end, on the side close to the gas inlet port 181*a*, of the second monitoring opening 188*b*. Therefore, as compared with a case in which the heating mechanism 400 is provided on the upstream side of the position, it is possible to suppress an increase in the deposition amount of tin S on the upstream side of the opening end, and the monitoring of the state of the plasma generation region AR or the vicinity thereof through the second monitoring opening 188*b* can be suppressed from being hindered by the deposited tin S.

5. DESCRIPTION OF EXTREME ULTRAVIOLET LIGHT GENERATION CHAMBER DEVICE OF SECOND EMBODIMENT

Next, the configuration of the EUV light generation chamber device 150 of a second embodiment will be described. Any component same as that described above is denoted by an identical reference sign, and duplicate description thereof is omitted unless specific description is needed.

5.1 Configuration

Figure 8:
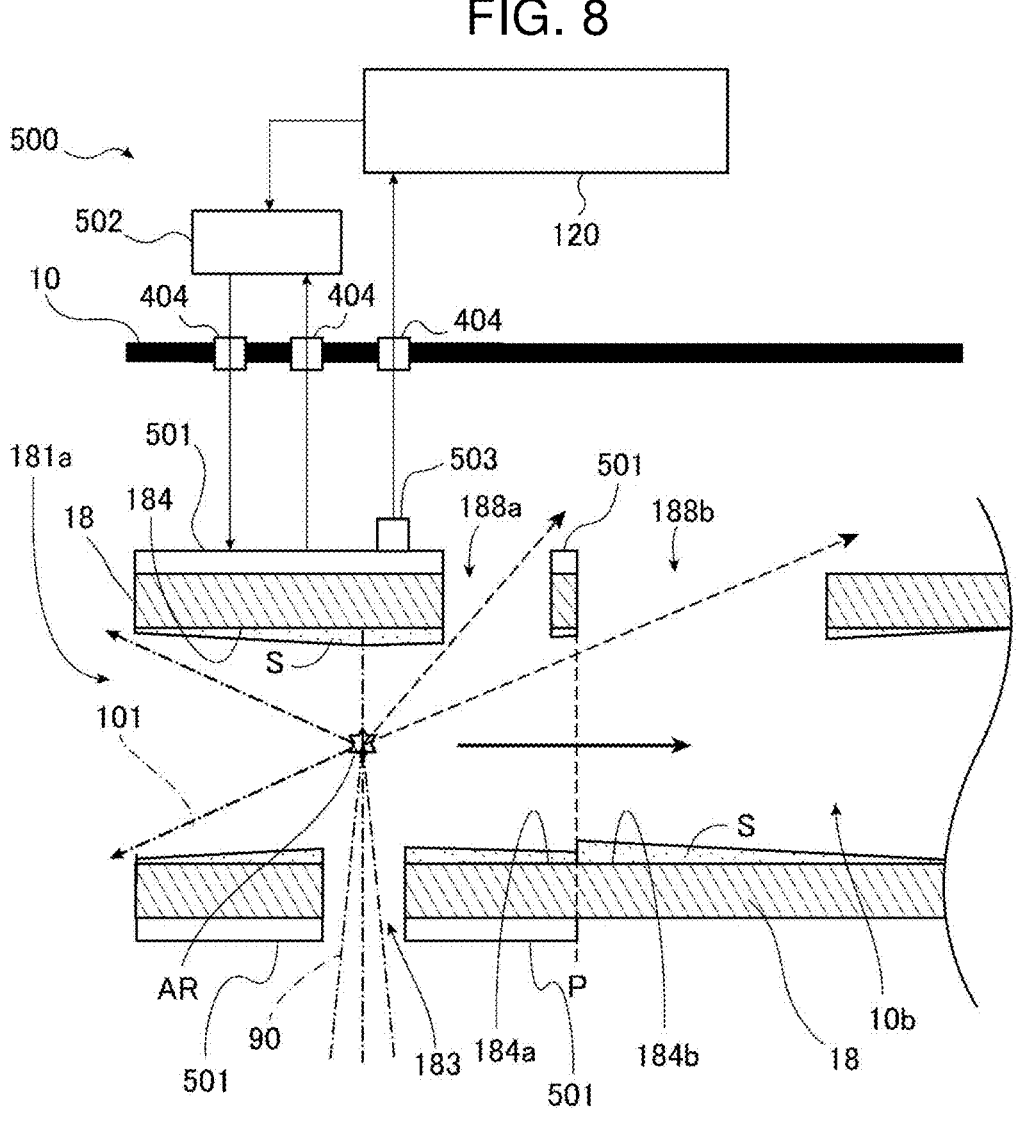
FIG. 8 is a view showing a state of the partition wall in the vicinity of the plasma generation region in a second embodiment.

FIG. 8 is a view showing a state of the partition wall 18 in the vicinity of the plasma generation region AR in the present embodiment. As shown in FIG. 8, the EUV light generation chamber device 150 of the present embodiment is different from the EUV light generation chamber device 150 of the comparative example in that a cooling mechanism 500 for cooling the inner circumferential surface 184 on the upstream side of the predetermined position P is included. Here, the predetermined position P in the present embodiment is the same position as that in the first embodiment.

The cooling mechanism 500 of the present embodiment includes a cooling unit 501, a cooling medium supply unit 502, and a temperature sensor 503. The cooling unit 501 is a heat exchanger capable of being cooled by a cooling medium supplied from the cooling medium supply unit 502. The cooling unit 501 is provided in contact with the entire circumference of the outer circumferential surface of the cylindrical partition wall 18 on the upstream side of the predetermined position P. The cooling unit 501 may be provided in the partition wall 18. The cooling unit 501 is connected to the cooling medium supply unit 502 provided outside the chamber 10 so that the cooling medium is capable of being supplied and collected. The temperature sensor 503 is electrically connected to the processor 120, detects the temperature of the cooling unit 501, and outputs the signal related to the detected temperature to the processor 120. A pipe for circulating the cooling medium between the cooling unit 501 and the cooling medium supply unit 502 and the wiring for outputting the signal from the temperature sensor 503 to the processor 120 penetrate the chamber 10 respectively via the through seal 404 having high airtightness. The cooling medium supply unit 502 is a heat exchanger that cools the cooling medium collected from the cooling unit 501 and supplies the cooled cooling medium to the cooling unit 501. The cooling medium supply unit 502 is electrically connected to the processor 120. The processor 120 controls the temperature of the cooling medium to be supplied from the cooling medium supply unit 502 to the cooling unit 501 based on the signal input from the temperature sensor 503 so that the partition wall 18 on the upstream side of the predetermined position P is maintained at a predetermined temperature. The temperature of the partition wall 18 maintained by the cooling mechanism 500 is, for example, 28° C. or lower during the operation of the EUV light generation chamber device 150.

5.2 Operation

Similarly to the comparative example, when the EUV light 101 is output, the generated stannane may be decomposed to produce tin S. In the present embodiment, on the upstream side of the predetermined position P in the partition wall 18, the cooling unit 501 of the cooling mechanism 500 lowers the temperature of the partition wall 18 to suppress decomposition of stannane, so that the deposition amount of tin S on the upstream inner circumferential surface 184a can be decreased.

5.3 Effect

As described above, the EUV light generation chamber device 150 according to the present embodiment includes the cooling mechanism 500 including the cooling unit 501 for cooling the upstream inner circumferential surface 184a of the partition wall 18. Therefore, as compared with a case in which the cooling mechanism 500 is not provided, the deposition amount of tin S on the upstream inner circumferential surface 184a can be decreased. Therefore, it is possible to suppress the incidence of the EUV light 101 generated in the plasma generation region AR on the EUV light concentrating mirror 15 from being hindered by the deposited tin S. Therefore, it is possible to suppress a decrease in the efficiency of outputting the EUV light 101 from the EUV light generation chamber device 150.

In the present embodiment, as described above, the predetermined position P is located at the opening end of the second monitoring opening 188b on the gas inlet port 181a side. Therefore, as compared with a case in which the predetermined position P is on the upstream side of the opening end of the second monitoring opening 188b, the amount of tin S deposited in the vicinity of the opening end can be reduced, and the monitoring of the state of the plasma generation region AR or the vicinity thereof through the second monitoring opening 188b can be suppressed from being hindered by the deposited tin S.

6. DESCRIPTION OF EXTREME ULTRAVIOLET LIGHT GENERATION CHAMBER DEVICE OF THIRD EMBODIMENT

Next, the configuration of the EUV light generation chamber device 150 of a third embodiment will be described. Any component same as that described above is denoted by an identical reference sign, and duplicate description thereof is omitted unless specific description is needed.

6.1 Configuration

Figure 9:
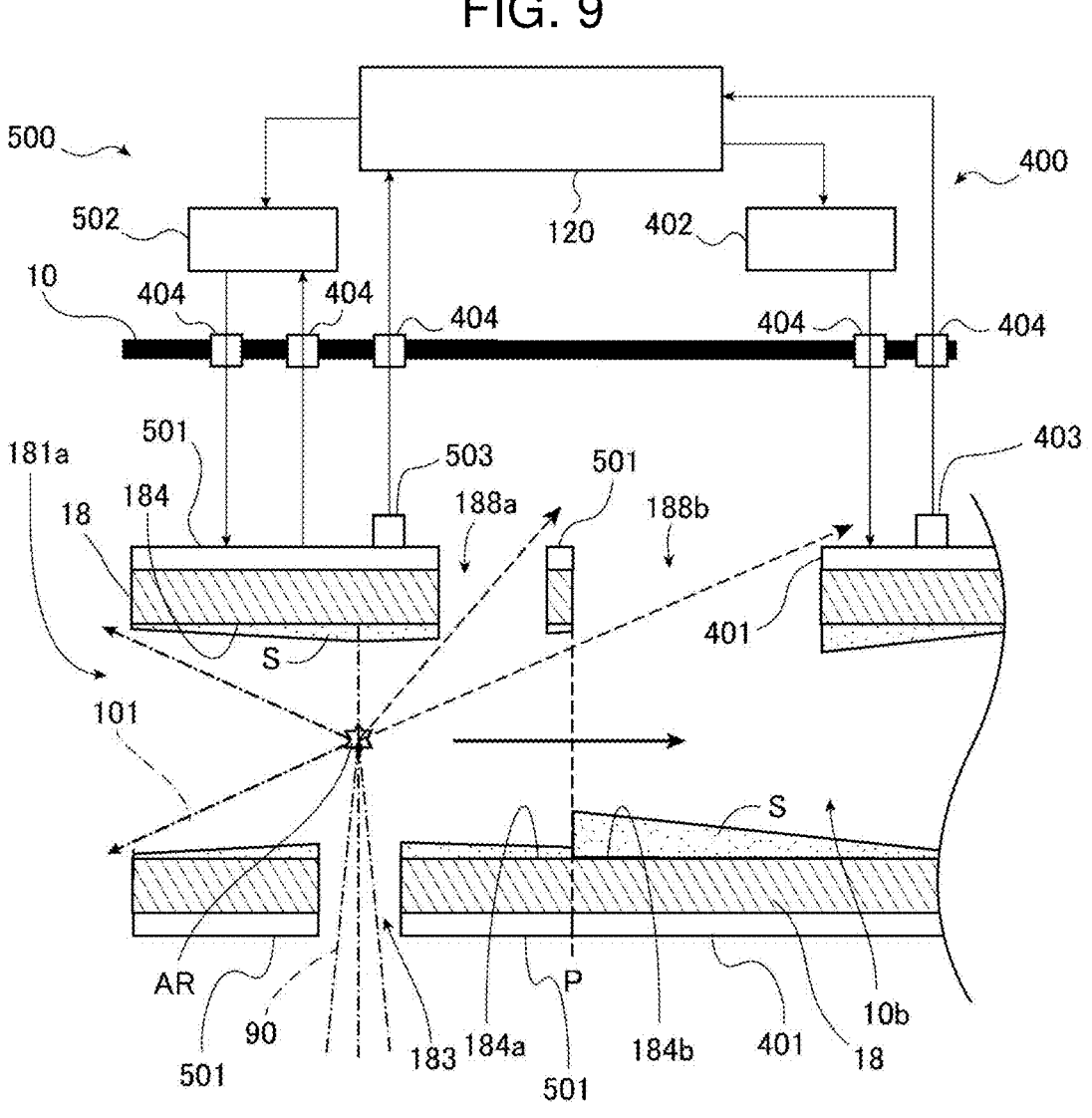
FIG. 9 is a view showing a state of the partition wall in the vicinity of the plasma generation region in a third embodiment.

FIG. 9 is a view showing a state of the partition wall 18 in the vicinity of the plasma generation region AR in the present embodiment. As shown in FIG. 9, the EUV light generation chamber device 150 of the present embodiment is different from the EUV light generation chamber device 150 of the comparative embodiment in that the cooling mechanism 500 for cooling the inner circumferential surface 184 of the partition wall 18 on the upstream side of the predetermined position P is provided as in the second embodiment, and the heating mechanism 400 for heating the inner circumferential surface 184 of the partition wall 18 on the downstream side of the predetermined position P is provided as in the first embodiment. Here, the predetermined position P in the present embodiment is the same position as that in the first embodiment.

6.2 Operation

Similarly to the comparative example, when the EUV light 101 is output, the generated stannane may be decomposed to produce tin S. In the present embodiment, on the upstream side of the predetermined position P in the partition wall 18, the cooling unit 501 of the cooling mechanism 500 lowers the temperature of the partition wall 18 to suppress decomposition of stannane in the same manner as in the second embodiment, so that the deposition amount of tin S on the upstream inner circumferential surface 184a can be decreased. Therefore, as compared with the comparative example, the density of stannane in the gas flowing from the predetermined position P to the downstream inner circumferential surface 184b can be increased. On the downstream side of the predetermined position P, as in the first embodiment, the heater 401 of the heating mechanism 400 increases the temperature of the partition wall 18 to promote the decomposition of stannane, so that the deposition amount of tin S on the downstream inner circumferential surface 184b can be increased. At this time, when the density of stannane in the gas flowing from the predetermined position P to the downstream inner circumferential surface 184b is high, more stannane can be decomposed than in the first embodiment, and more tin S can be deposited than in the first embodiment.

6.3 Effect

The EUV light generation chamber device 150 of the present embodiment includes the cooling mechanism 500 and the heating mechanism 400. Therefore, as in the second embodiment, as compared with a case in which the cooling mechanism 500 is not provided, the deposition amount of tin S on the upstream inner circumferential surface 184a can be decreased. Therefore, as in the second embodiment, the incidence of the EUV light 101 generated in the plasma generation region AR on the EUV light concentrating mirror 15 can be suppressed from being hindered by the deposited tin S, and the efficiency of outputting the EUV light 101 from the EUV light generation chamber device 150 can be suppressed from being decreased. Further, as in the first embodiment, compared with a case in which the heating mechanism 400 is not provided, the deposition amount of tin S on the downstream inner circumferential surface 184b can be increased. Therefore, as compared with the second embodiment, the amount of tin S flowing into the exhaust device 180 can be suppressed to extend the life of the exhaust device 180, and the interval of maintenance such as replacement of the exhaust device 180 can be extended to increase the operation efficiency of the EUV light generation chamber device 150.

Further, in the present embodiment, as described above, the density of stannane in the gas flowing through the predetermined position P can be increased, and the deposition amount of tin S on the downstream side of the predetermined position P can be increased as compared with the first embodiment.

Further, as in the second embodiment, the predetermined position P is located at the opening end of the second monitoring opening 188b on the gas inlet port 181a side. Therefore, as compared with a case in which the predetermined position P is on the upstream side of the opening end of the second monitoring opening 188b, the monitoring of the state of the plasma generation region AR or the vicinity thereof through the second monitoring opening 188b can be suppressed from being hindered by the deposited tin S.

7. DESCRIPTION OF EXTREME ULTRAVIOLET LIGHT GENERATION CHAMBER DEVICE OF FOURTH EMBODIMENT

Figure 10:
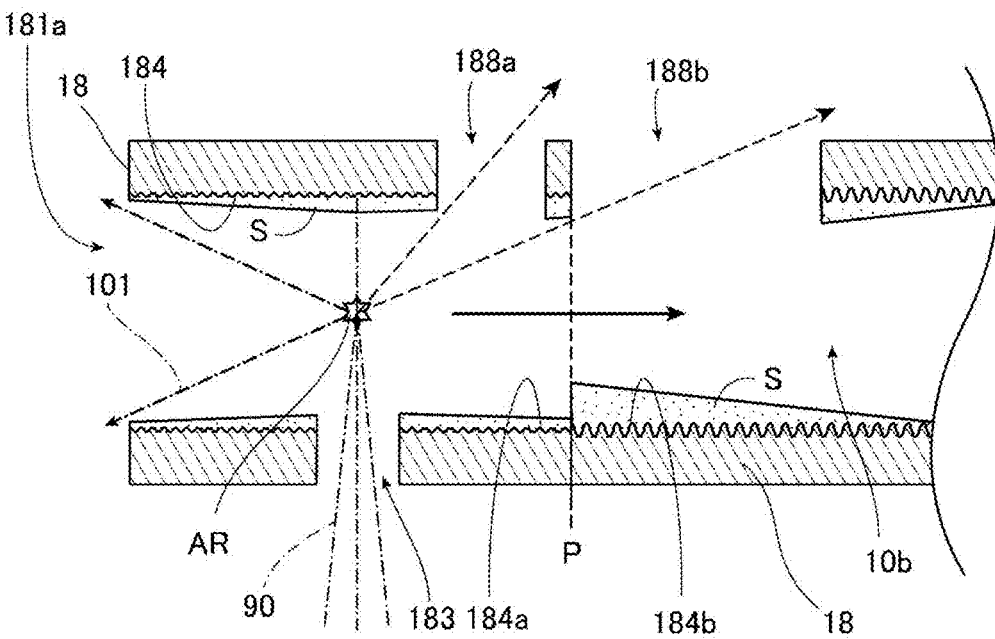
FIG. 10 is a view showing a state of the partition wall in the vicinity of the plasma generation region in a fourth embodiment.

Next, the configuration of the EUV light generation chamber device 150 of a fourth embodiment will be described. Any component same as that described above is denoted by an identical reference sign, and duplicate description thereof is omitted unless specific description is needed.
7.1 Configuration FIG. 10 is a view showing a state of the partition wall 18 in the vicinity of the plasma generation region AR in the present embodiment. As shown in FIG. 10, the EUV light generation chamber device 150 of the present embodiment is different from the EUV light generation chamber device 150 of the comparative embodiment in that the surface roughness of the downstream inner circumferential surface 184b is larger than the surface roughness of the upstream inner circumferential surface 184a. In the present embodiment, the surface roughness of the upstream inner circumferential surface 184a is, for example, Ra1.6 or less, and the surface roughness of the downstream inner circumferential surface 184b is, for example, Ra25 or more. Here, the predetermined position P in the present embodiment is the same position as that in the first embodiment.
7.2 Operation Similarly to the comparative example, when the EUV light 101 is output, the generated stannane may be decomposed to produce tin S. The adhesion probability when tin S generated from stannane collides and the probability that tin S is removed by the etching gas after adhesion vary depending on the surface roughness of the inner circumferential surface 184 of the partition wall 18, and as a result, the ease of deposition varies. Tin S is more likely to be deposited on a surface having a large surface roughness. Therefore, a larger amount of tin S can be deposited on the downstream inner circumferential surface 184b than on the upstream inner circumferential surface 184a.
7.3 Effect In the EUV light generation chamber device 150 of the present embodiment, the roughness of the downstream inner circumferential surface 184b is larger than that of the upstream inner circumferential surface 184a. Therefore, as described above, a larger amount of tin S can be deposited on the downstream inner circumferential surface 184b than on the upstream inner circumferential surface 184a.

8. DESCRIPTION OF EXTREME ULTRAVIOLET LIGHT GENERATION CHAMBER DEVICE OF FIFTH EMBODIMENT

Next, the configuration of the EUV light generation chamber device 150 of a fifth embodiment will be described.

Any component same as that described above is denoted by an identical reference sign, and duplicate description thereof is omitted unless specific description is needed.
8.1 Configuration The appearance of the EUV light generation chamber device 150 of the present embodiment is similar to the appearance of the EUV light generation chamber device 150 of the comparative example. However, the EUV light generation chamber device 150 of the present embodiment is different from the EUV light generation chamber device 150 of the comparative example in that the material of the downstream inner circumferential surface 184b is a material on which tin S is more likely to be deposited than on the material of the upstream inner circumferential surface 184a. The material of the upstream inner circumferential surface 184a may be, for example, at least one of $TiO_2$, $SiO_2$, $ZrO_2$, and the material of the downstream inner circumferential surface 184b may be, for example, at least one of stainless steel and aluminum. Here, the predetermined position P in the present embodiment is the same position as that in the first embodiment.
8.2 Operation Similarly to the comparative example, when the EUV light 101 is output, the generated stannane may be decomposed to produce tin S. The adhesion probability when tin S generated from stannane collides and the probability that tin S is removed by the etching gas after adhesion vary depending on the material of the inner circumferential surface 184 of the partition wall 18, and as a result, the ease of deposition varies. In the present embodiment, the material of the downstream inner circumferential surface 184b is a material on which tin S is more likely to be deposited than on the material of the upstream inner circumferential surface 184a by utilizing the difference in ease of deposition. Therefore, a larger amount of tin S can be deposited on the downstream inner circumferential surface 184b than on the upstream inner circumferential surface 184a.
8.3 Effect In the EUV light generation chamber device 150 of the present embodiment, in the partition wall 18, the material of the downstream inner circumferential surface 184b is a material on which tin S is more likely to be deposited than on the material of the upstream inner circumferential surface 184a. Therefore, as described above, a larger amount of tin S can be deposited on the downstream inner circumferential surface 184b than on the upstream inner circumferential surface 184a.

9. SUMMARY

Figure 11:
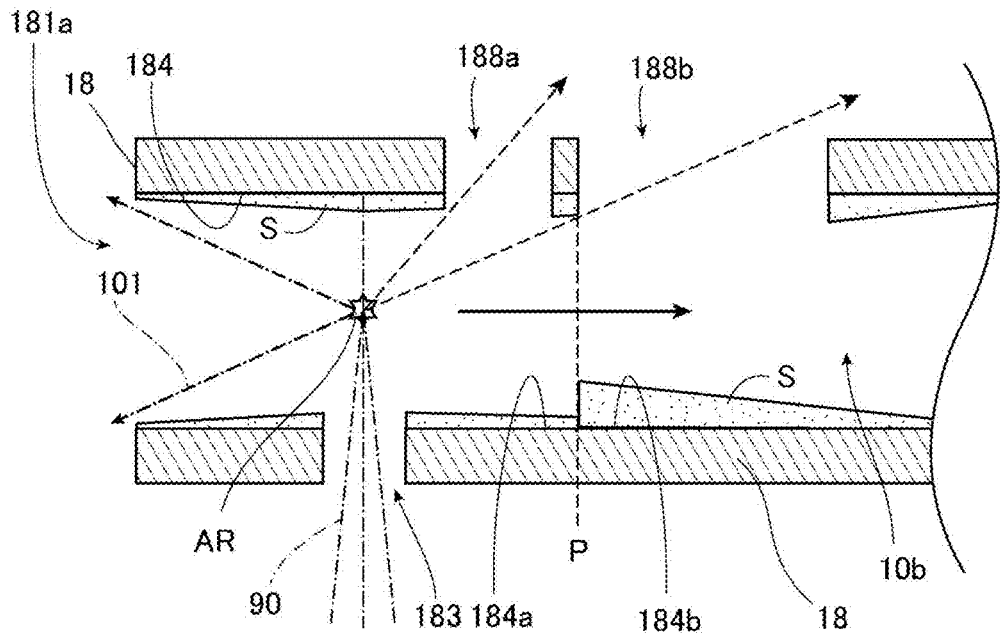
FIG. 11 is a view schematically showing a deposition pattern formed as a result of deposition of tin on the partition wall in the vicinity of the plasma generation region.

FIG. 11 is a view schematically showing a deposition pattern formed commonly in each embodiment as a result of deposition of tin S on the partition wall 18 in the vicinity of the plasma generation region AR.

As shown in FIG. 11, unlike the comparative example, in the EUV light generation chamber device 150 of each embodiment, tin S is more likely to be deposited on the downstream inner surface 184b the circumferential of partition wall 18 than on the upstream inner circumferential surface 184a. Therefore, more tin S may be deposited on the downstream side than on the upstream side of the partition wall 18. That is, the average deposition rate of tin S is larger on the downstream side of the predetermined position P than on the upstream side. The average deposition rate of tin S on the upstream inner circumferential surface 184a is preferably, for example, 3 mm/year or less, and the average deposition rate of tin S on the downstream inner circumferential surface 184*b* is preferably, for example, 10 mm/year or more. This also applies to the embodiments described above.

Although the embodiments of the present invention have been described above as examples, the above-described embodiments can be modified as appropriate. For example, at least one of the cooling mechanism 500 similar to that of the second embodiment and the heating mechanism 400 similar to that of the first embodiment may be provided on the partition wall 18 of the fourth embodiment in which the upstream inner circumferential surface 184*a* and the downstream inner circumferential surface 184*b* have different surface roughnesses. Further, at least one of the cooling mechanism 500 similar to that of the second embodiment and the heating mechanism 400 similar to that of the first embodiment may be provided on the partition wall 18 of the fifth embodiment in which the upstream inner circumferential surface 184*a* and the downstream inner circumferential surface 184*b* are made of different materials. Further, the partition wall 18 may not be provided with the first to third monitoring openings 188*a* to 188*c*.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation chamber device comprising:
   a chamber including, at an internal space thereof, a plasma generation region in which plasma is generated from a droplet target of tin irradiated with laser light;
   a gas supply port arranged at the chamber and configured to supply an etching gas containing hydrogen to the internal space;
   a cylindrical partition wall extending from the internal space to outside the chamber, surrounding the plasma generation region, and having an opening on the internal space side as an inlet port of a gas and an opening at the outside of the chamber as an exhaust port of the gas;
   an exhaust device configured to exhaust the gas from the exhaust port to outside the chamber; and
   a concentrating mirror arranged outside the partition wall at the internal space and configured to concentrate extreme ultraviolet light generated at the plasma generation region;
   the partition wall having an inner circumferential surface on which tin is more likely to be deposited on a downstream side of a predetermined position on a downstream side of the plasma generation region in a flow direction of the gas inside the partition wall than on an upstream side of the predetermined position.

2. The extreme ultraviolet light generation chamber device according to claim 1,
   wherein the partition wall includes at least one monitoring opening for monitoring a state of the plasma generation region or a vicinity thereof.

3. The extreme ultraviolet light generation chamber device according to claim 2,
   wherein the predetermined position is at a position same in a longitudinal direction of the partition wall as an opening end, on a side close to the inlet port, of the one monitoring opening.

4. The extreme ultraviolet light generation chamber device according to claim 3,
   wherein an average deposition rate of tin on the inner circumferential surface on the upstream side of the predetermined position is 3 mm/year or less, and an average deposition rate of tin on the inner circumferential surface on the downstream side of the predetermined position is 10 mm/year or more.

5. The extreme ultraviolet light generation chamber device according to claim 1,
   further comprising a cooling mechanism configured to cool the inner circumferential surface on the upstream side of the predetermined position.

6. The extreme ultraviolet light generation chamber device according to claim 5,
   wherein the partition wall includes at least one monitoring opening for monitoring a state of the plasma generation region or a vicinity thereof, and
   the predetermined position is at a position same in a longitudinal direction of the partition wall as an opening end, on a side close to the inlet port, of the one monitoring opening.

7. The extreme ultraviolet light generation chamber device according to claim 5,
   wherein the cooling mechanism cools the inner circumferential surface on the upstream side of the predetermined position to 28° C. or lower.

8. The extreme ultraviolet light generation chamber device according to claim 1,
   further comprising a heating mechanism configured to heat the inner circumferential surface on the downstream side of the predetermined position.

9. The extreme ultraviolet light generation chamber device according to claim 8,
   wherein the partition wall includes at least one monitoring opening for monitoring a state of the plasma generation region or a vicinity thereof, and
   the predetermined position is at a position same in a longitudinal direction of the partition wall as an opening end, on a side close to the inlet port, of the one monitoring opening.

10. The extreme ultraviolet light generation chamber device according to claim 8,
   wherein the heating mechanism heats the inner circumferential surface on the downstream side of the predetermined position to 40° C. or higher.

11. The extreme ultraviolet light generation chamber device according to claim 1,
   further comprising:
   a cooling mechanism configured to cool the inner circumferential surface on the upstream side of the predetermined position; and
   a heating mechanism configured to heat the inner circumferential surface on the downstream side of the predetermined position.

12. The extreme ultraviolet light generation chamber device according to claim 11, wherein the partition wall includes at least one monitoring opening for monitoring a state of the plasma generation region or a vicinity thereof, and the predetermined position is at a position same in a longitudinal direction of the partition wall as an opening end, on a side close to the inlet port, of the one monitoring opening.

13. The extreme ultraviolet light generation chamber device according to claim 1, wherein tin is more likely to be deposited on a material of the inner circumferential surface on the downstream side of the predetermined position than on a material of the inner circumferential surface on the upstream side of the predetermined position.

14. The extreme ultraviolet light generation chamber device according to claim 13, wherein the material of the inner circumferential surface on the upstream side of the predetermined position is at least one of $TiO_2$, $SiO_2$, $ZrO_2$, and the material of the inner circumferential surface on the downstream side of the predetermined position is at least one of stainless steel and aluminum.

15. The extreme ultraviolet light generation chamber device according to claim 1, wherein a surface roughness of the inner circumferential surface on the downstream side of the predetermined position is larger than a surface roughness of the inner circumferential surface on the upstream side of the predetermined position.

16. The extreme ultraviolet light generation chamber device according to claim 15, wherein the surface roughness of the inner circumferential surface on the upstream side of the predetermined position is Ra1.6 or less, and the surface roughness of the inner circumferential surface on the downstream side of the predetermined position is Ra25 or more.

17. An electronic device manufacturing method, comprising:

outputting extreme ultraviolet light generated using an extreme ultraviolet light generation chamber device to an exposure apparatus; and exposing a photosensitive substrate to the extreme ultraviolet light in the exposure apparatus to manufacture an electronic device, the extreme ultraviolet light generation chamber device including:

a chamber including, at an internal space thereof, a plasma generation region in which plasma is generated from a droplet target of tin irradiated with laser light;

a gas supply port arranged at the chamber and configured to supply an etching gas containing hydrogen to the internal space;

a cylindrical partition wall extending from the internal space to outside the chamber, surrounding the plasma generation region, and having an opening on the internal space side as an inlet port of a gas and an opening at the outside of the chamber as an exhaust port of the gas;

an exhaust device configured to exhaust the gas from the exhaust port to outside the chamber; and a concentrating mirror arranged outside the partition wall at the internal space and configured to concentrate the extreme ultraviolet light generated at the plasma generation region, and the partition wall having an inner circumferential surface on which tin is more likely to be deposited on a downstream side of a predetermined position on a downstream side of the plasma generation region in a flow direction of the gas inside the partition wall than on an upstream side of the predetermined position.

18. An electronic device manufacturing method, comprising:

inspecting a defect of a mask by irradiating the mask with extreme ultraviolet light generated using an extreme ultraviolet light generation chamber device;

selecting the mask using a result of the inspection; and exposing and transferring a pattern formed on the selected mask onto a photosensitive substrate, the extreme ultraviolet light generation chamber device including:

a chamber including, at an internal space thereof, a plasma generation region in which plasma is generated from a droplet target of tin irradiated with laser light;

a gas supply port arranged at the chamber and configured to supply an etching gas containing hydrogen to the internal space;

a cylindrical partition wall extending from the internal space to outside the chamber, surrounding the plasma generation region, and having an opening on the internal space side as an inlet port of a gas and an opening at the outside of the chamber as an exhaust port of the gas;

an exhaust device configured to exhaust the gas from the exhaust port to outside the chamber; and a concentrating mirror arranged outside the partition wall at the internal space and configured to concentrate the extreme ultraviolet light generated at the plasma generation region, and the partition wall having an inner circumferential surface on which tin is more likely to be deposited on a downstream side of a predetermined position on a downstream side of the plasma generation region in a flow direction of the gas inside the partition wall than on an upstream side of the predetermined position.

* * * * *